US011116088B2

(12) United States Patent
Ohashi et al.

(10) Patent No.: US 11,116,088 B2
(45) Date of Patent: Sep. 7, 2021

(54) SEMICONDUCTOR STORAGE DEVICE

(71) Applicant: TOSHIBA MEMORY CORPORATION, Minato-ku (JP)

(72) Inventors: Shinya Ohashi, Kamakura (JP); Katsumi Izawa, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/566,210

(22) Filed: Sep. 10, 2019

(65) Prior Publication Data

US 2020/0305290 A1 Sep. 24, 2020

(30) Foreign Application Priority Data

Mar. 19, 2019 (JP) .............................. JP2019-050996

(51) Int. Cl.
*H05K 5/00* (2006.01)
*H05K 1/18* (2006.01)
(Continued)

(52) U.S. Cl.
CPC ............. *H05K 5/006* (2013.01); *H05K 1/117* (2013.01); *H05K 1/181* (2013.01); *H05K 5/0052* (2013.01); *H05K 5/03* (2013.01); *H05K 9/0024* (2013.01); *H05K 2201/09172* (2013.01); *H05K 2201/10159* (2013.01); *H05K 2201/10371* (2013.01); *H05K 2201/10522* (2013.01)

(58) Field of Classification Search
CPC ........ H05K 5/006; H05K 1/117; H05K 1/181; H05K 5/03; H05K 5/0052; H05K 9/0024; H05K 2201/10371; H05K 2201/10159; H05K 2201/10522; H05K 2201/09172
See application file for complete search history.

(56) References Cited

U.S. PATENT DOCUMENTS 5,898,344 A * 4/1999 Hayashi ............... H05K 3/3405
331/67
5,966,052 A * 10/1999 Sakai ................ H01L 23/49805
257/E23.061
(Continued)

FOREIGN PATENT DOCUMENTS

JP 8-18269 A 1/1996
JP 2013-228869 A 11/2013
WO WO 2014/021046 A1 2/2014

*Primary Examiner* — Hung S. Bui
*Assistant Examiner* — Sagar Shrestha
(74) *Attorney, Agent, or Firm* — Oblon, McClelland, Maier & Neustadt, L.L.P.

(57) ABSTRACT

According to one embodiment, in a semiconductor storage device, a conductive cover is provided on a side of the principal surface, and covers at least a part of the memory and the controller. A substrate has a first notched portion and a second notched portion in an outer edge. The conductive cover has a top plate portion, a first side plate portion, a second side plate portion, a first claw portion, and a second claw portion. The first claw portion is extended from a lower end of the first side plate in a direction intersecting with the principal surface. The first claw portion is fitted into the first notched portion. The second claw portion is extended from a lower end of the second side plate in the direction intersecting with the principal surface. The second claw portion is fitted into the second notched portion.

18 Claims, 6 Drawing Sheets

(51) Int. Cl.
*H05K 5/03* (2006.01)
*H05K 1/11* (2006.01)
*H05K 9/00* (2006.01)

(56) References Cited

U.S. PATENT DOCUMENTS

| | | | | |
|---|---|---|---|---|
| 6,079,099 | A * | 6/2000 | Uchida | H05K 3/3405 |
| | | | | 174/382 |
| 6,482,679 | B1 * | 11/2002 | Kato | H05K 3/3405 |
| | | | | 438/121 |
| 6,687,135 | B1 * | 2/2004 | Kitade | H05K 3/3405 |
| | | | | 174/365 |
| 6,694,610 | B1 * | 2/2004 | Kitade | H05K 3/3405 |
| | | | | 29/840 |
| 7,362,586 | B2 * | 4/2008 | Mashimo | H05K 3/3405 |
| | | | | 174/260 |
| 8,665,601 | B1 * | 3/2014 | Mangay-Ayam, Jr. | G11C 5/04 |
| | | | | 361/752 |
| 2009/0109637 | A1 * | 4/2009 | Shimakawa | H05K 9/0026 |
| | | | | 361/728 |
| 2013/0286298 | A1 | 10/2013 | Sakuma et al. | |
| 2014/0111933 | A1 | 4/2014 | Knopf et al. | |
| 2014/0226293 | A1 * | 8/2014 | Sato | H05K 9/00 |
| | | | | 361/752 |
| 2015/0255702 | A1 * | 9/2015 | Takebayashi | H05K 9/0024 |
| | | | | 310/321 |
| 2015/0256127 | A1 * | 9/2015 | Takebayashi | H03H 9/0552 |
| | | | | 331/68 |
| 2018/0035551 | A1 * | 2/2018 | Woo | H05K 1/117 |
| 2019/0246508 | A1 * | 8/2019 | Oh | G06F 3/0626 |

* cited by examiner

SEMICONDUCTOR STORAGE DEVICE

CROSS-REFERENCE TO RELATED APPLICATIONS

This application is based upon and claims the benefit of priority from Japanese Patent Application No. 2019-050996, filed on Mar. 19, 2019; the entire contents of which are incorporated herein by reference.

FIELD

Embodiments described herein relate generally to a semiconductor storage device.

BACKGROUND

In a semiconductor storage device, there is a case where a conductive cover is attached to a substrate on which a semiconductor component is mounted. Here, it is demanded to appropriately attach the conductive cover to the substrate.

DETAILED DESCRIPTION

In general, according to one embodiment, there is provided a semiconductor storage device including a substrate, a memory and a controller, and a conductive cover. The substrate has a principal surface. The memory and the controller are arranged on the principal surface. The conductive cover is provided on a side of the principal surface. The conductive cover covers at least a part of the memory and the controller. The substrate has a first notched portion and a second notched portion in an outer edge. The conductive cover has a top plate portion, a first side plate portion, a second side plate portion, a first claw portion, and a second claw portion. The first claw portion is extended from a lower end of the first side plate in a direction intersecting with the principal surface. The first claw portion is fitted into the first notched portion. The second claw portion is extended from a lower end of the second side plate in the direction intersecting with the principal surface. The second claw portion is fitted into the second notched portion.

Exemplary embodiments of a semiconductor storage device will be explained below in detail with reference to the accompanying drawings. The present invention is not limited to the following embodiments.

Embodiment

A semiconductor storage device according to the embodiment is configured by mounting of a semiconductor component on a substrate. In this semiconductor storage device, there is a case where a conductive cover is attached to the substrate and covers the semiconductor component. The conductive cover includes a conductor and is electrically connected to reference potential (such as ground potential). Also, a solid pattern including a conductor is arranged on an inner part, a surface, or a rear surface of the substrate and is electrically connected to the reference potential (such as ground potential). Accordingly, since the semiconductor component is surrounded by the conductive cover and the solid pattern (ground layer) at the reference potential, it is possible to control emission of an electromagnetic interference (EMI) noise from the semiconductor component to the outside and to control reception of the EMI noise from the outside by the semiconductor component.

Since being electrically connected to the reference potential, the conductive cover is preferably not in contact with a part that may have potential different from the reference potential (such as electrode and/or terminal that may have potential different from reference potential) on the substrate. That is, it is demanded to appropriately attach the conductive cover to the substrate in such a manner that a position of the conductive cover with respect to the substrate is not deviated.

For example, in a semiconductor storage device following a form factor standard of a single-side mounting type (such as M.2-2230 standard), there is a case of attaching a conductive cover to a substrate by generating a hole for shield fixation in the substrate, providing a protruded portion, which corresponds to the hole, at a lower end of the conductive cover, and fitting the protruded portion into the hole. According to restriction by a form factor standard, a conductive cover is required to have an outer outline placed on an inner side of an end portion of the substrate in a planar view, and to have a height equal to or lower than a predetermined height from the substrate in a side view. According to this requirement, when a hole for fixation of the conductive cover is provided in a position separated from the end portion of the substrate for a distance with which mechanical strength of the substrate can be secured, a component on the substrate is mounted on a position on an inner side of the hole. With this arrangement, a mountable region on the substrate is likely to be small.

On the one hand, there is a case of attaching a conductive cover to a substrate by forming a hook-shaped claw (horizontal claw) in a side edge portion of the conductive cover, providing a notch corresponding to this claw in an end portion of the substrate, fitting the claw and the notch into each other, and sliding the conductive cover in a direction of a plane part of the claw. In this case, a notch is provided in the end portion of the substrate in a notch width, which corresponds to the plane part of the claw, from the end portion of the substrate and a component on the substrate is mounted on a position on an inner side of the notch width. That is, since the notch corresponds to the horizontal claw, the notch width of the notch is likely to be large. Accordingly, a position where a component can be mounted on the substrate is limited, and a mountable region on the substrate is likely to be small.

Thus, in the present embodiment, it is aimed to reduce a notch width of a notched portion and to accordingly increase a mountable region by providing a vertical claw portion in a lower end of a side plate of a conductive cover and providing a notched portion fitted into the claw portion in an outer edge of a substrate in a semiconductor storage device.

Figure 1:
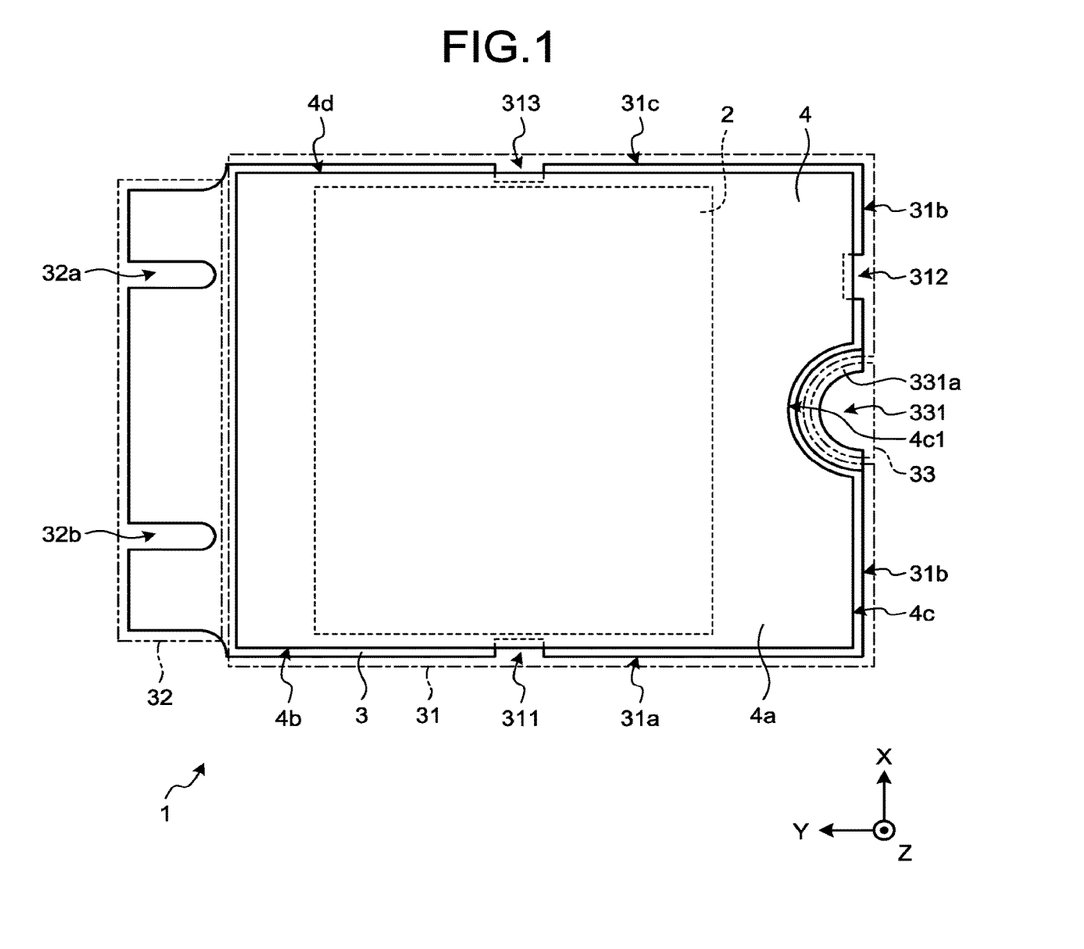
FIG. 1 is a plan view illustrating a configuration of a semiconductor storage device according to an embodiment.
Figure 2:
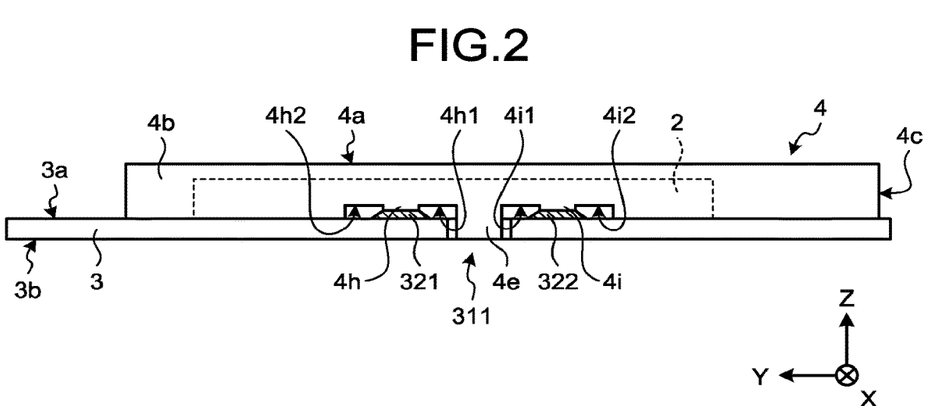
FIG. 2 is a side view illustrating the configuration of the semiconductor storage device according to the embodiment.
Figure 3:
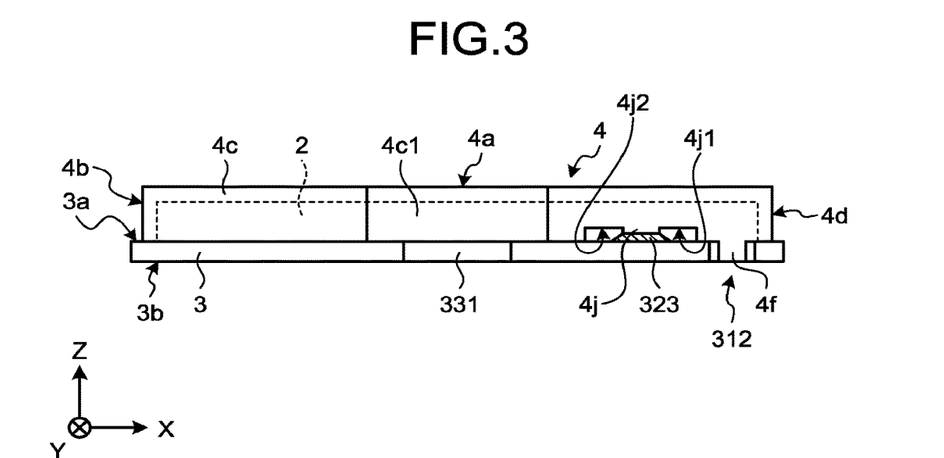
FIG. 3 is a rear view illustrating the configuration of the semiconductor storage device according to the embodiment.
Figure 4:
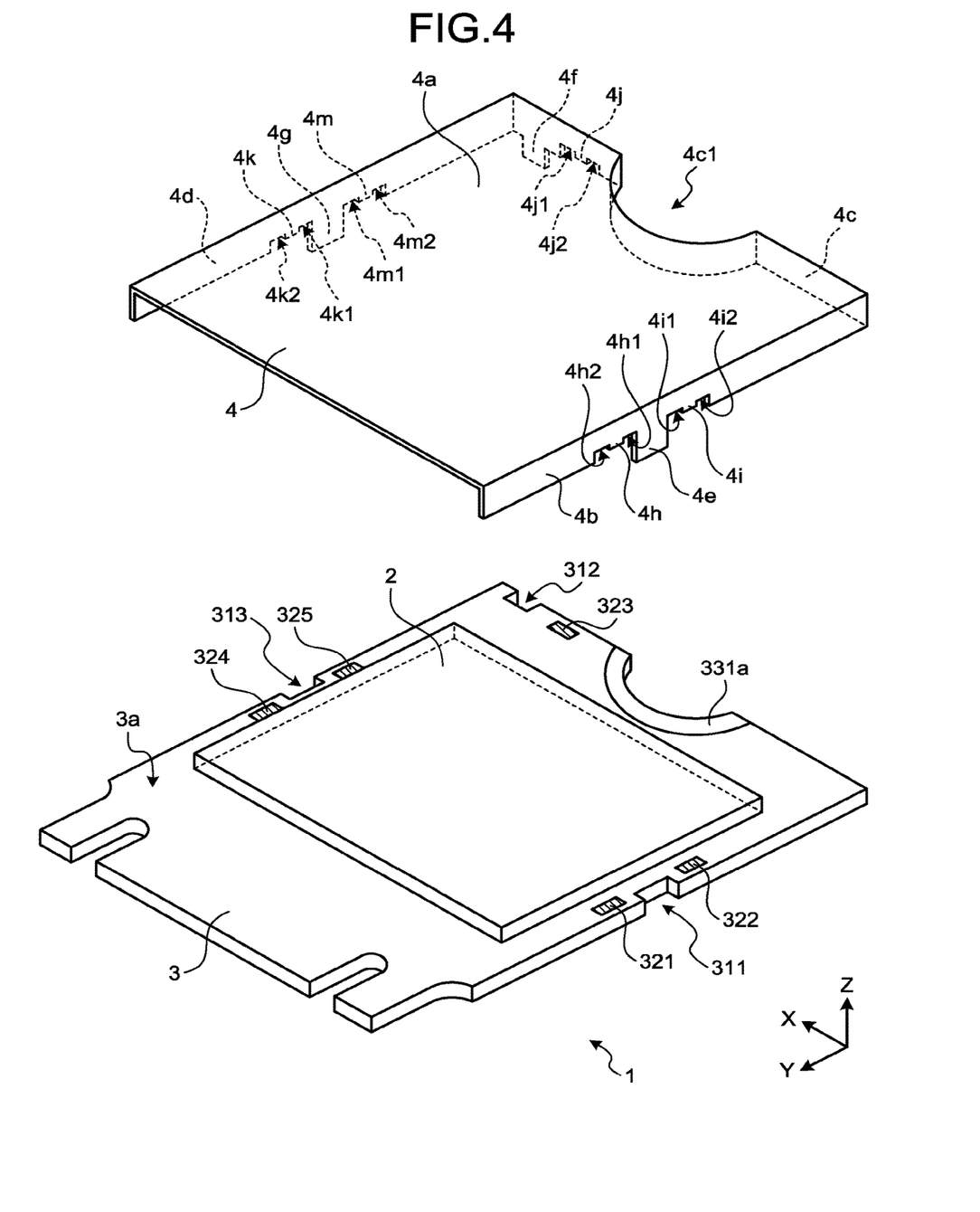
FIG. 4 is an exploded perspective view illustrating the configuration of the semiconductor storage device according to the embodiment.

Specifically, a semiconductor storage device 1 may be configured in a manner illustrated in FIG. 1 to FIG. 4. FIG. 1 is a plan view illustrating a configuration of a semiconductor storage device; FIG. 2 is a side view illustrating a configuration of the semiconductor storage device 1; FIG. 3 is a rear view illustrating the configuration of the semiconductor storage device 1; and FIG. 4 is an exploded perspective view illustrating the configuration of the semiconductor storage device 1. In the following, it is assumed that a direction vertical to a surface 3a of a substrate 3 is a Z direction, a longitudinal direction of the substrate 3 is a Y direction, and a direction vertical to the Z direction and the Y direction is an X direction.

The semiconductor storage device 1 is, for example, a memory device such as a solid state drive (SSD), and may function as an external storage device with respect to a host device (not illustrated) by being connected to the host device in a communicable manner. The host device may be, for example, an information processing device such as a personal computer, a mobile phone, an imaging device, a mobile terminal such as a tablet computer or a smartphone, a game device, or an in-vehicle terminal such as a car navigation system.

The semiconductor storage device 1 includes a semiconductor component 2, a substrate 3, and a conductive cover 4. The semiconductor component 2 is a package of a semiconductor chip on which a semiconductor integrated circuit is mounted, or the like and may be configured as a system on chip (SoC) including a controller and a non-volatile memory, for example.

As illustrated in FIG. 1, the substrate 3 has a substantially rectangular shape in an XY planar view. The substrate 3 includes a component-mounted portion 31, a connector 32, and a screwed portion 33. The component-mounted portion 31 is a part in the substrate 3 in which part the semiconductor component 2 and a different component (such as smoothing capacitor or the like (not illustrated)) are mounted on the surface 3a (principal surface on +Z side) and to which part the conductive cover 4 is attached. The conductive cover 4 may include a material in which a conductive substance (such as metal) is a principal component. The connector 32 is a part connected to a connector of the host device. The screwed portion 33 is a part screwed into a chassis or the like of the host device.

The connector 32 has a shape corresponding to a requirement of a form factor standard (such as M.2-2230 standard). In the connector 32, a notch-shaped notches 32a and 32b are respectively provided in a position of an "M key" and a position of a "B & M key" in the form factor standard. Note that although a plurality of terminals (plurality of pins) is arranged in a region between the notches 32a and 32b, a region on a +X-side of the notch 32a, and a region on a −X-side of the notch 32b in the connector 32, illustration thereof is omitted in FIG. 1 to FIG. 4 for simplification of the illustration. The screwed portion 33 has a shape corresponding to a requirement of the form factor standard. A notch 331 is provided in the screwed portion 33.

In the screwed portion 33, a conductive pattern may be arranged in a part 331a with which a screw is in contact when the screw is fitted into the notch 331. In a case where the conductive pattern is electrically connected to a solid pattern, when the screwed portion 33 is screwed, the solid pattern (ground layer) is electrically connected to reference potential (such as ground potential) through the chassis of the host device.

The component-mounted portion 31 has a shape shaped within a range of the form factor standard. The component-mounted portion 31 has a plurality of notched portions 311, 312, and 313 in an outer edge of the substrate 3. With respect to the plurality of notched portions 311, 312, and 313, at least a part of the notches is arranged in a side different form that of the other notches in the outer edge of the substrate 3.

As illustrated in FIG. 1, the outer edge of the substrate 3 includes a plurality of sides 31a to 31c that is along a substantially rectangular shape. The side 31a is arranged on the −X-side of the other sides 31b and 31c and is extended in the Y direction. The side 31b is arranged in a position between the other sides 31b and 31c in the X direction and is extended in the X direction. The side 31a is arranged on the +X-side of the other sides 31b and 31c and is extended in the Y direction. The notched portion 311 is arranged in the side 31a, the notched portion 312 is arranged in the side 31b, and the notched portion 313 is arranged in the side 31c.

The notched portion 311 is arranged on the −X-side of the notched portion 313 and on the −X-side and a +Y-side of the notched portion 312. The notched portion 311 is recessed in a +X direction from an end portion on the −X-side of the substrate 3 (side 31a). For example, the notched portion 311 may be formed in a substantially rectangular shape with the Y direction as a longitudinal direction in an XY planar view.

The notched portion 312 is arranged on the +X-side and a −Y-side of the notched portion 311 and on the −X-side and the −Y-side of the notched portion 313. The notched portion 312 is recessed in a +Y direction from an end portion on the −Y-side of the substrate 3 (side 31b). For example, the notched portion 312 may be formed in a substantially rectangular shape with the X direction as a longitudinal direction in the XY planar view.

The notched portion 313 is arranged on the +X-side of the notched portion 311 and on the +X-side and the +Y-side of the notched portion 312. The notched portion 313 is recessed in a −X direction from an end portion on the +X-side of the substrate 3 (side 31c). For example, the notched portion 313 may be formed in a substantially rectangular shape with the Y direction as a longitudinal direction in the XY planar view.

Also, the component-mounted portion 31 includes a plurality of conductive pads 321, 322, 323, 324, and 325 on the surface 3a. Each of the conductive pads 321 to 325 is arranged in a position around the notched portions 311, 312, and 313 on the surface 3a. Each of the conductive pads 321 to 325 is a part with which the conductive cover 4 needs to be in contact, and is electrically connected to the solid pattern (ground layer) on the substrate 3. With this arrangement, the conductive cover 4 is electrically connected to the reference potential (such as ground potential) through the conductive pads 321 to 325 and the solid pattern (ground layer) when being attached to the substrate 3.

The conductive pad 321 is arranged on a position on the +Y-side of the notched portion 311 on the surface 3a. The conductive pad 321 may include a material in which an electric conductor (such as copper) is a principal component. The conductive pad 321 may be formed in a substantially rectangular shape with the Y direction as a longitudinal direction in the XY planar view.

The conductive pad 322 is arranged on a position on the −Y-side of the notched portion 311 on the surface 3a. The conductive pad 322 may include a material in which an electric conductor (such as copper) is a principal component. The conductive pad 322 may be formed in a substantially rectangular shape with the Y direction as a longitudinal direction in the XY planar view.

The conductive pad 323 is arranged on a position on the −X-side of the notched portion 312 on the surface 3a. The conductive pad 323 may include a material in which a conductor (such as copper) is a principal component. The conductive pad 323 may be formed in a substantially rectangular shape with the X direction as a longitudinal direction in the XY planar view.

The conductive pad 324 is arranged on a position on the +Y-side of the notched portion 313 on the surface 3a. The conductive pad 324 may include a material in which an electric conductor (such as copper) is a principal component. The conductive pad 324 may be formed in a substantially rectangular shape with the Y direction as a longitudinal direction in the XY planar view.

The conductive pad 325 is arranged on a position on the −Y-side of the notched portion 313 on the surface 3a. The conductive pad 325 may include a material in which an electric conductor (such as copper) is a principal component. The conductive pad 325 may be formed in a substantially rectangular shape with the Y direction as a longitudinal direction in the XY planar view.

As illustrated in FIG. 2 to FIG. 4, the conductive cover 4 is attached to the surface 3a of the substrate 3 and covers the semiconductor component 2. In FIG. 2 and FIG. 3, a position of the semiconductor component 2 in the conductive cover 4 is indicated by a dotted line. In the XY planar view, a plane dimension of the conductive cover 4 may be a dimension corresponding to the substrate 3 (see FIG. 1). With this arrangement, a different component (such as smoothing capacitor) may be mounted in a periphery (such as region on −Y-side) of the semiconductor component 2 on the substrate 3, although not illustrated.

The conductive cover 4 has a top plate 4a and a plurality of side plates 4b to 4d. The top plate 4a is extended in the XY direction and has a substantially square shape or a substantially rectangular shape in the XY planar view. The side plate 4b is extended in a −Z direction from an end portion on the −X-side of the top plate 4a, and has a substantially rectangular shape with the Y direction as a longitudinal direction in a YZ planar view. The side plate 4c is extended in the −Z direction from an end portion on the −Y-side of the top plate 4a, and has a substantially rectangular shape with the X direction as a longitudinal direction in an XZ planar view. The side plate 4d is extended in the −Z direction from an end portion on the +X-side of the top plate 4a, and has a substantially rectangular shape with the Y direction as a longitudinal direction in the YZ planar view. The +Y-side of the top plate 4a in the conductive cover 4 is released in such a manner that a wiring line or the like is easily arranged between the semiconductor component 2 and the connector 32 covered with the conductive cover 4.

Note that the side plate 4c has a recessed surface portion 4c1 recessed to the −Y-side in a manner corresponding to a shape of a screw to be screwed into the screwed portion 33. The recessed surface portion 4c1 may be recessed to the −Y-side in a semicircular shape in the XY planar view (see FIG. 1).

Also, the conductive cover 4 has a plurality of claw portions 4e, 4f, and 4g, a plurality of protruded portions 4h, 4i, 4j, 4k, and 4m, and a plurality of recessed portions 4h1, 4h2, 4i1, 4i2, 4j1, 4j2, 4k1, 4k2, 4m1, and 4m2.

The plurality of claw portions 4e, 4f, and 4g respectively correspond to the plurality of notched portions 311, 312, and 313 in the substrate 3. Each of the claw portions 4e, 4f, and 4g may be configured in a vertical type extended in the −Z direction from a lower end side of the conductive cover 4.

The claw portion 4e is extended in a direction intersecting with the substrate 3 (Z direction) from a lower end (end portion on −Z side) of the side plate 4b and is fitted into the notched portion 311. In a YZ side view, a leading end of the claw portion 4e is not protruded from the substrate 3 to a rear surface side (−Z side). A leading end surface of the claw portion 4g is along an extended surface of a rear surface (principal surface on −Z side) 3b of the substrate 3. The claw portion 4f is extended in the direction intersecting with the substrate 3 (Z direction) from a lower end (end portion on −Z side) of the side plate 4c and is fitted into the notched portion 312. In an XZ side view, a leading end of the claw portion 4f is not protruded from the substrate 3 to the rear surface side (−Z side). A leading end surface of the claw portion 4f is along the extended surface of the rear surface (principal surface on −Z side) 3b of the substrate 3. The claw portion 4g is extended in the direction intersecting with the substrate 3 (Z direction) from a lower end (end portion on −Z side) of the side plate 4d and is fitted into the notched portion 313. In the YZ side view, a leading end of the claw portion 4e is not protruded from the substrate 3 to the rear surface side (−Z side). The leading end surface of the claw portion 4g is along the extended surface of the rear surface (principal surface on −Z side) 3b of the substrate 3.

An inner surface of the claw portion 4e faces an end surface (surface on −X-side) of the notched portion 311. An outer surface of the claw portion 4e is along an extended line of the outer edge of the substrate 3 in the XY planar view. The outer surface of the claw portion 4e is placed on an inner side of the outer edge of the substrate 3. A surface on the −X-side of the claw portion 4e is placed on the +X-side of an end portion on the −X-side of the substrate 3. An inner surface of the claw portion 4f faces an end surface (surface on −Y-side) of the notched portion 312. An outer surface of the claw portion 4f is along the extended line of the outer edge of the substrate 3 in the XY planar view. The outer surface of the claw portion 4f is placed on the inner side of the outer edge of the substrate 3. A surface on the −Y-side of the claw portion 4e is placed on the +Y-side of an end portion on the −Y-side of the substrate 3. An inner surface of the claw portion 4g faces an end surface (surface on +X-side) of the notched portion 313. An outer surface of the claw portion 4g is along the extended line of the outer edge of the substrate 3 in the XY planar view. The outer surface of the claw portion 4g is placed on the inner side of the outer edge of the substrate 3. A surface on the +X-side of the claw portion 4g is placed on the −X-side of an end portion on the +X-side of the substrate 3.

An outer surface of the claw portion 4e is included in a surface continuous with an outer surface of the side plate 4b. A surface on the −X-side of the claw portion 4e is connected to a surface on the −X-side of the side plate 4b, the surface on the −X-side of the claw portion 4e and the surface on the −X-side of the side plate 4b being arranged in substantially equal X positions. An outer surface of the claw portion 4f is included in a surface continuous with an outer surface of the side plate 4c. A surface on the −Y-side of the claw portion 4f is connected to a surface on the −Y-side of the side plate 4c, the surface on the −Y-side of the claw portion 4f and the surface on the −Y-side of the side plate 4c being arranged in substantially equal Y positions. An outer surface of the claw portion 4g is included in a surface continuous with an outer surface of the side plate 4d. A surface on the +X-side of the claw portion 4g is connected to a surface on the +X-side of the side plate 4d, the surface on the +X-side of the claw portion 4g and the surface on the +X-side of the side plate 4d being arranged in substantially equal X positions.

The plurality of protruded portions 4*h*, 4*i*, 4*j*, 4*k*, and 4*m* respectively correspond to the plurality of conductive pads 321, 322, 323, 324, and 325 on the substrate 3. Each of the protruded portions 4*h*, 4*i*, 4*j*, 4*k*, and 4*m* is in contact with the corresponding conductive pad in attachment of the conductive cover 4.

The protruded portion 4*h* is extended in the direction intersecting with the substrate 3 (Z direction) from a lower end (end portion on −Z side) of the side plate 4*b* and is in contact with the conductive pad 321. The protruded portion 4*h* may be arranged in a position proximate to the claw portion 4*e* on the +Y-side at the lower end of the side plate 4*b*. A part, which is adjacent to the +Y-side and the −Y-side of the protruded portion 4*h*, at the lower end of the side plate 4*b* may be formed as a recessed portion recessed to the +Z side compared to the protruded portion 4*h*. A leading end (end portion on −Z side) of the protruded portion 4*h* is placed on a surface 3*a* side (+Z side) compared to a leading end (end portion on −Z side) of the claw portion 4*e* in the YZ side view. In the YZ side view, a leading end (end portion on −Z side) of the protruded portion 4*h* is placed on a side of becoming far from the surface 3*a* (+Z side) compared to the surface 3*a* of the substrate 3.

The protruded portion 4*i* is extended in the direction intersecting with the substrate 3 (Z direction) from the lower end (end portion on −Z side) of the side plate 4*b* and is in contact with the conductive pad 322. The protruded portion 4*i* may be arranged in a position proximate to the claw portion 4*e* on the −Y-side at the lower end of the side plate 4*b*. A part, which is adjacent to the +Y-side and the −Y-side of the protruded portion 4*i*, at the lower end of the side plate 4*b* may be formed as a recessed portion recessed to the +Z side compared to the protruded portion 4*h*. A leading end (end portion on −Z side) of the protruded portion 4*i* is placed on the surface 3*a* side (+Z side) of the leading end (end portion on −Z side) of the claw portion 4*e* in the YZ side view. In the YZ side view, a leading end (end portion on −Z side) of the protruded portion 4*i* is placed on a side of becoming far from the surface 3*a* (+Z side) compared to the surface 3*a* of the substrate 3.

The protruded portion 4*j* is extended in the direction intersecting with the substrate 3 (Z direction) from a lower end (end portion on −Z side) of the side plate 4*c* and is in contact with the conductive pad 323. The protruded portion 4*j* may be arranged in a position proximate to the claw portion 4*f* on the −X-side at the lower end of the side plate 4*c*. A part, which is adjacent to the +X-side and the −X-side of the protruded portion 4*j*, at the lower end of the side plate 4*c* may be formed as a recessed portion recessed to the +Z side compared to the protruded portion 4*j*. A leading end (end portion on −Z side) of the protruded portion 4*j* is placed on the surface 3*a* side (+Z side) of the leading end (end portion on −Z side) of the claw portion 4*f* in the XZ side view. In the XZ side view, the leading end (end portion on −Z side) of the protruded portion 4*j* is placed on the side of becoming far from the surface 3*a* (+Z side) compared to the surface 3*a* of the substrate 3.

The protruded portion 4*k* is extended in the direction intersecting with the substrate 3 (Z direction) from a lower end (end portion on −Z side) of the side plate 4*d* and is in contact with the conductive pad 324. The protruded portion 4*k* may be arranged in a position proximate to the claw portion 4*g* on the +Y-side at the lower end of the side plate 4*d*. A part, which is adjacent to the +Y-side and the −Y-side of the protruded portion 4*k*, at the lower end of the side plate 4*d* may be formed as a recessed portion recessed to the +Z side compared to the protruded portion 4*k*. A leading end (end portion on −Z side) of the protruded portion 4*k* is placed on the surface 3*a* side (+Z side) compared to the leading end (end portion on −Z side) of the claw portion 4*g* in the YZ side view. In the YZ side view, the leading end (end portion on −Z side) of the protruded portion 4*k* is placed on the side of becoming far from the surface 3*a* (+Z side) of the surface 3*a* of the substrate 3.

The protruded portion 4*m* is extended in the direction intersecting with the substrate 3 (Z direction) from the lower end (end portion on −Z side) of the side plate 4*d* and is in contact with the conductive pad 325. The protruded portion 4*m* may be arranged in a position proximate to the claw portion 4*g* on the −Y-side at the lower end of the side plate 4*b*. A part, which is adjacent to the +Y-side and the −Y-side of the protruded portion 4*m*, at the lower end of the side plate 4*d* may be formed as a recessed portion recessed to the +Z side compared to the protruded portion 4*m*. A leading end (end portion on −Z side) of the protruded portion 4*m* is placed on a surface 3*a* side (+Z side) of the leading end (end portion on −Z side) of the claw portion 4*g* in the YZ side view. In the YZ side view, the leading end (end portion on −Z side) of the protruded portion 4*m* is placed on the side of becoming far from the surface 3*a* (+Z side) compared to the surface 3*a* of the substrate 3.

The plurality of recessed portions 4*h*1, 4*h*2, 4*i*1, 4*i*2, 4*j*1, 4*j*2, 4*k*1, 4*k*2, 4*m*1, and 4*m*2 correspond to the plurality of protruded portions 4*h*, 4*i*, 4*j*, 4*k*, and 4*m*. Each of the recessed portions 4*h*1, 4*h*2, 4*i*1, 4*i*2, 4*j*1, 4*j*2, 4*k*1, 4*k*2, 4*m*1, and 4*m*2 faces the surface 3*a* of the substrate 3 in attachment of the conductive cover 4.

The recessed portion 4*h*1 is arranged between the protruded portion 4*h* and the claw portion 4*e*. The −Y-side of the recessed portion 4*h*1 is adjacent to the protruded portion 4*h*. The recessed portion 4*h*1 is recessed to the side of becoming far from the surface 3*a* (+Z side) compared to the protruded portion 4*h* in the YZ side view. The recessed portion 4*h*1 is recessed to the side of becoming far from the surface 3*a* (+Z side) compared to the claw portion 4*e* in the YZ side view.

The recessed portion 4*h*2 is arranged on an opposite side of the claw portion 4*e* with respect to the protruded portion 4*h*. The +Y-side of the recessed portion 4*h*2 is adjacent to the protruded portion 4*h*. The recessed portion 4*h*2 is recessed to the side of becoming far from the surface 3*a* (+Z side) compared to the protruded portion 4*h* in the YZ side view. The recessed portion 4*h*2 is recessed to the side of becoming far from the surface 3*a* (+Z side) compared to the claw portion 4*e* in the YZ side view.

The recessed portion 4*i*1 is arranged between the protruded portion 4*i* and the claw portion 4*e*. The +Y-side of the recessed portion 4*i*1 is adjacent to the protruded portion 4*i*. The recessed portion 4*i*1 is recessed to the side of becoming far from the surface 3*a* (+Z side) compared to the protruded portion 4*i* in the YZ side view. The recessed portion 4*i*1 is recessed to the side of becoming far from the surface 3*a* (+Z side) compared to the claw portion 4*e* in the YZ side view.

The recessed portion 4*i*2 is arranged on an opposite side of the claw portion 4*e* with respect to the protruded portion 4*i*. The −Y-side of the recessed portion 4*i*2 is adjacent to the protruded portion 4*i*. The recessed portion 4*i*2 is recessed to the side of becoming far from the surface 3*a* (+Z side) compared to the protruded portion 4*i* in the YZ side view. The recessed portion 4*i*2 is recessed to the side of becoming far from the surface 3*a* (+Z side) compared to the claw portion 4*e* in the YZ side view.

The recessed portion 4*j*1 is arranged between the protruded portion 4*j* and the claw portion 4*f*. The +Y-side of the recessed portion 4*j*1 is adjacent to the protruded portion 4*j*.

The recessed portion 4j1 is recessed to the side of becoming far from the surface 3a (+Z side) compared to the protruded portion 4j in the XZ side view. The recessed portion 4j1 is recessed to the side of becoming far from the surface 3a (+Z side) compared to the claw portion 4f in the XZ side view.

The recessed portion 4j2 is arranged on an opposite side of the claw portion 4f with respect to the protruded portion 4j. The −Y-side of the recessed portion 4j2 is adjacent to the protruded portion 4j. The recessed portion 4j2 is recessed to the side of becoming far from the surface 3a (+Z side) compared to the protruded portion 4j in the XZ side view. The recessed portion 4j2 is recessed to the side of becoming far from the surface 3a (+Z side) compared to the claw portion 4f in the XZ side view.

The recessed portion 4m1 is arranged between the protruded portion 4m and the claw portion 4g. The +Y-side of the recessed portion 4m1 is adjacent to the protruded portion 4m. The recessed portion 4m1 is recessed to the side of becoming far from the surface 3a (+Z side) compared to the protruded portion 4m in the YZ side view. The recessed portion 4m1 is recessed to the side of becoming far from the surface 3a (+Z side) compared to the claw portion 4g in the YZ side view.

The recessed portion 4m2 is arranged on an opposite side of the claw portion 4g with respect to the protruded portion 4m. The −Y-side of the recessed portion 4m2 is adjacent to the protruded portion 4m. The recessed portion 4m2 is recessed to the side of becoming far from the surface 3a (+Z side) compared to the protruded portion 4m in the YZ side view. The recessed portion 4m2 is recessed to the side of becoming far from the surface 3a (+Z side) compared to the claw portion 4g in the YZ side view.

The recessed portion 4k1 is arranged between the protruded portion 4k and the claw portion 4g. The −Y-side of the recessed portion 4k1 is adjacent to the protruded portion 4k. The recessed portion 4k1 is recessed to the side of becoming far from the surface 3a (+Z side) compared to the protruded portion 4k in the YZ side view. The recessed portion 4k1 is recessed to the side of becoming far from the surface 3a (+Z side) compared to the claw portion 4g in the YZ side view.

The recessed portion 4k2 is arranged on an opposite side of the claw portion 4g with respect to the protruded portion 4k. The +Y-side of the recessed portion 4k2 is adjacent to the protruded portion 4k. The recessed portion 4k2 is recessed to the side of becoming far from the surface 3a (+Z side) compared to the protruded portion 4k in the YZ side view. The recessed portion 4k2 is recessed to the side of becoming far from the surface 3a (+Z side) compared to the claw portion 4g in the YZ side view.

As illustrated in FIG. 1 to FIG. 4, a notch width of the notched portion 311 (recess width in +X direction) corresponds to a plate thickness of the conductive cover 4. A notch width of the notched portion 312 (recess width in +Y direction) corresponds to the plate thickness of the conductive cover 4. A notch width of the notched portion 313 (recess width in −X direction) corresponds to the plate thickness of the conductive cover 4.

Figure 5:
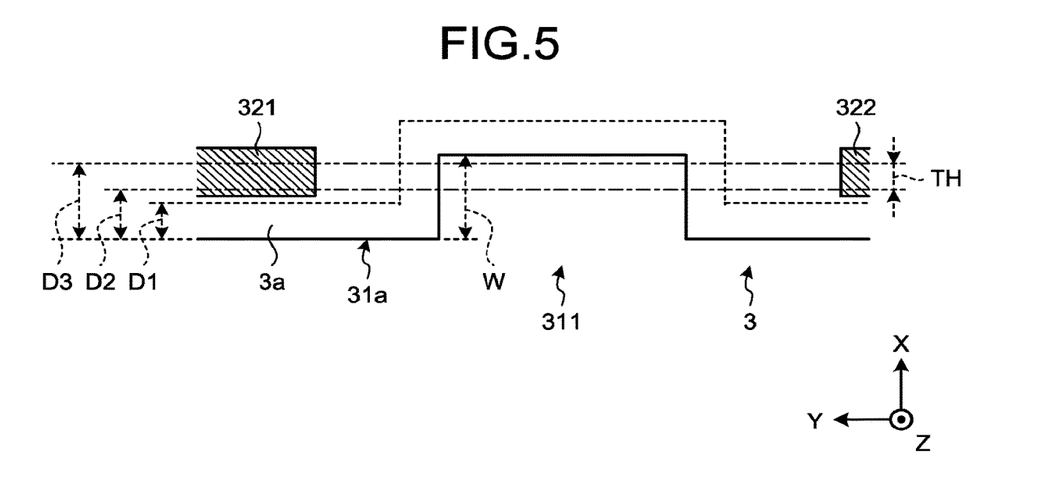
FIG. 5 is an enlarged plan view illustrating a configuration of a notched portion in the embodiment.

For example, a detailed notch width of the notched portion 311 may be configured in a manner illustrated in FIG. 5. FIG. 5 is an enlarged plan view illustrating a configuration near the notched portion 311. As indicated by a dotted line in FIG. 5, on the surface 3a of the substrate 3, a pattern can be mounted in a region, which is on an inner side for a distance D1 or more from the end portion of the substrate 3, according to the form factor standard and the conductive pads 321 and 322 are arranged in this region. In FIG. 5, a surface position of an outer surface (surface on −X-side) of the side plate 4b of when the conductive cover 4 is attached to the substrate 3 is indicated by a dashed-dotted line, and a surface position of an inner surface (surface on +X-side) of the side plate 4b is indicated by a dashed-two dotted line. When it is assumed that distances from the outer edge (side 31a) of the substrate 3 on the +Y-side of the notched portion 311 to the dotted line, the dashed-dotted line, and the dashed-two dotted line are respectively D1, D2, and D3, the following mathematical expression 1 is preferably satisfied in order to enable the conductive cover 4 to come in contact with the conductive pad 321 when being attached to the substrate 3.

$$D2>D1 \qquad \text{Mathematical expression 1}$$

Also, when it is assumed that a notch width of the notched portion 311 (recess width in +X direction) is W, the following mathematical expression 2 is preferably satisfied in order to make it possible to fit the claw portion 4e into the notched portion 311 when the conductive cover 4 is attached to the substrate 3.

$$W \geq D3 \qquad \text{Mathematical expression 2}$$

Here, when it is assumed that a plate thickness of the conductive cover 4 is TH, the following mathematical expression 3 is satisfied.

$$TH=D3-D2 \qquad \text{Mathematical expression 3}$$

The following mathematical expression 4 is derived from the mathematical expression 1 to the mathematical expression 3.

$$W \geq TH+D2 > TH+D1 \qquad \text{Mathematical expression 4}$$

According to the mathematical expression 4, it is understood that the notch width W of the notched portion 311 can be reduced to a value in a degree in which a slight margin is added to the sum of the plate thickness TH of the conductive cover 4 and the distance D1 required by the form factor standard. For example, when D1=0.3 mm, D2=0.4 mm, D3=0.6 mm, and W=0.7 mm, the notch width W of the notched portion 311 can satisfy a condition indicated by the mathematical expression 4. With this arrangement, it is possible to efficiently reduce the notch width W of the notched portion 311.

As described above, in the semiconductor storage device 1 in the embodiment, the vertical claw portions 4e, 4f, and 4g are provided at the lower end of the side plates 4b, 4c, and 4d of the conductive cover 4, and the notched portions 311, 312, and 313 fitted into the claw portions 4e, 4f, and 4g are provided in the outer edge of the substrate 3. With this arrangement, it is possible to efficiently reduce the notch width of the notched portions 311, 312, and 313 and to expand a mountable region.

Note that notched portions in the substrate 3 only need to be provided in at least two different sides in the outer edge of the substrate 3, and claw portions in the conductive cover 4 only need to be provided correspondingly at lower ends of at least two side plates. With this arrangement, it is possible to prevent a deviation of a position of the conductive cover 4 with respect to the substrate 3.

Figure 6:
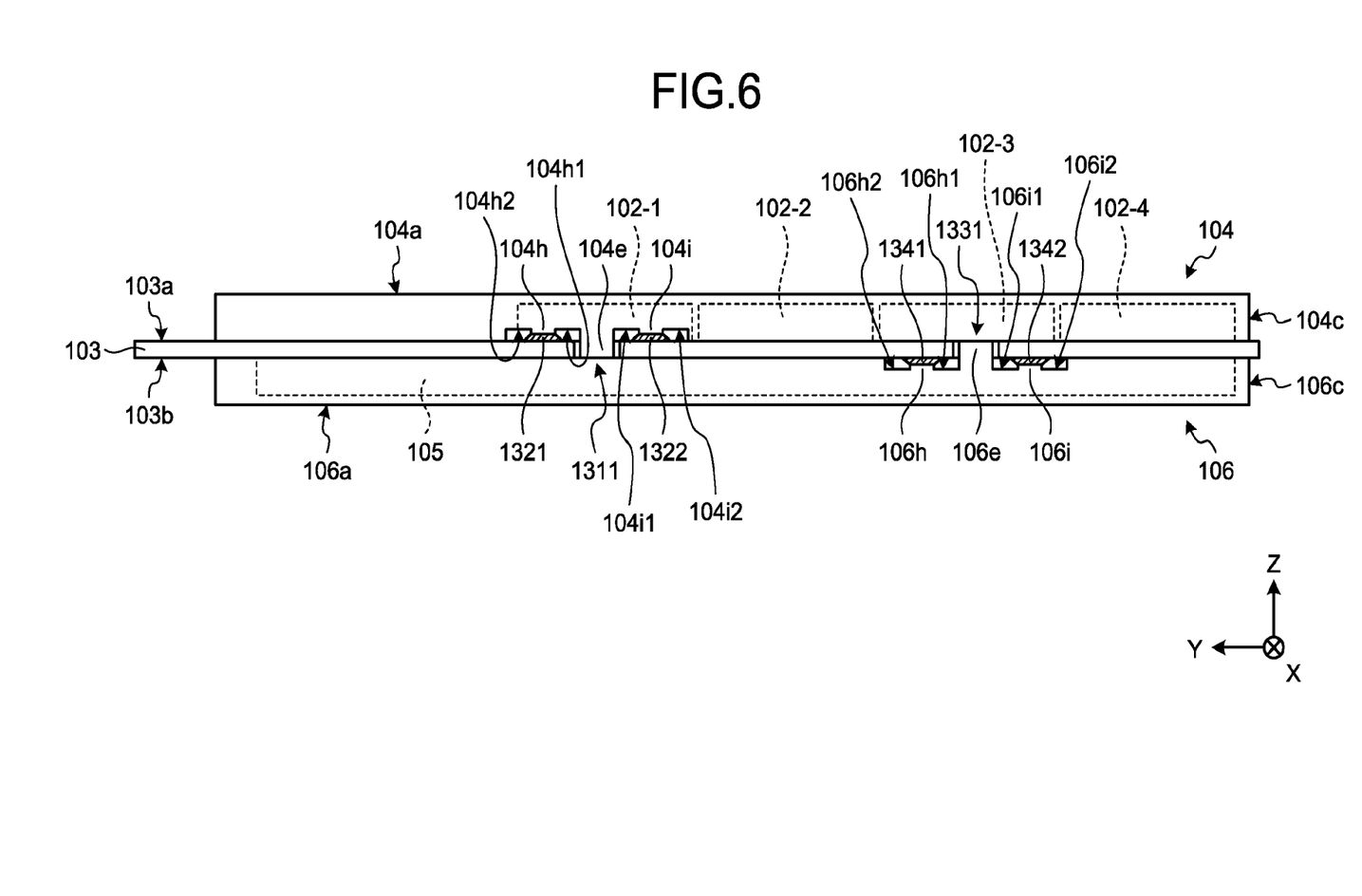
FIG. 6 is a side view illustrating a configuration of a semiconductor storage device according to a modification example of the embodiment.
Figure 7:
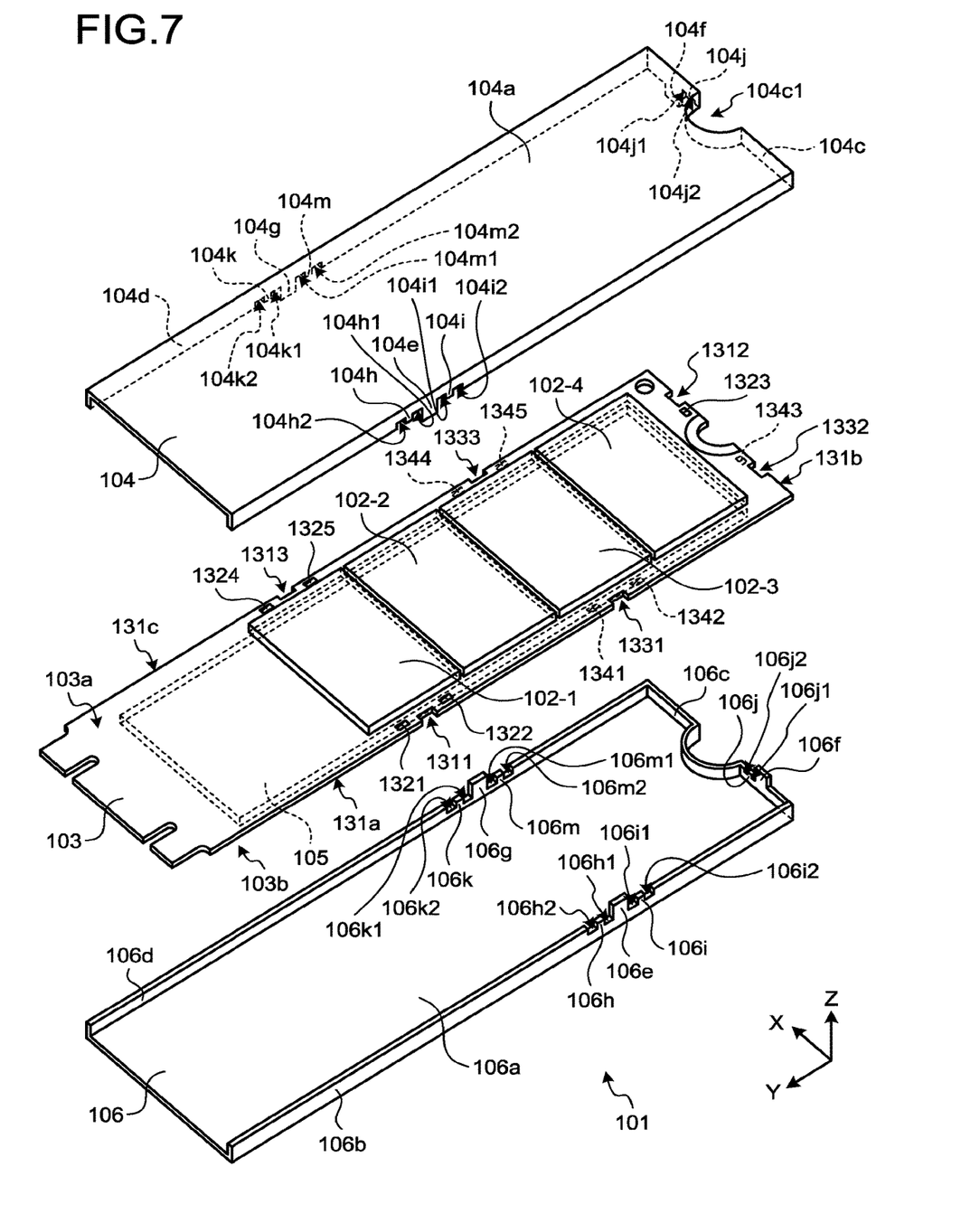
FIG. 7 is an exploded perspective view illustrating a configuration of the semiconductor storage device according to the modification example of the embodiment.

Also, an idea of the embodiment may be applied to a semiconductor storage device following a form factor standard of a double-side mounting type (such as M.2-2280 standard) as illustrated in FIG. 6 and FIG. 7. FIG. 6 is a side view illustrating a configuration of a semiconductor storage device 101 according to a modification example of the embodiment. FIG. 7 is an exploded perspective view illustrating the configuration of the semiconductor storage device 101 according to the modification example of the embodiment.

The semiconductor storage device 101 includes semiconductor components 102-1 to 102-4, a semiconductor component 105, a substrate 103, a conductive cover 104, and a conductive cover 106. Each of the semiconductor components 102-1 to 102-4 is a package of a semiconductor chip on which a semiconductor integrated circuit is mounted, or the like and is mounted on a surface (principal surface on +Z side) 103a of the substrate 103. The semiconductor component 105 is a package of a semiconductor chip on which a semiconductor integrated circuit is mounted, or the like and is mounted on a rear surface (principal surface on −Z side) 103b of the substrate 103. The conductive cover 104 is attached to the surface 103a of the substrate 103 and covers the semiconductor components 102-1 to 102-4. The conductive cover 106 is attached to the rear surface 103b of the substrate 103 and covers the semiconductor component 105.

The substrate 103 includes notched portions 1311 to 1313 and conductive pads 1321 to 1325 corresponding to the conductive cover 104, and includes notched portions 1331 to 1333 and conductive pads 1341 to 1345 corresponding to the conductive cover 106.

The notched portion 1311 and the notched portion 1331 are arranged in positions that do not interfere with each other in a side 131a. The notched portion 1312 and the notched portion 1332 are arranged in positions that do not interfere with each other in a side 131b. The notched portion 1313 and the notched portion 1333 are arranged in positions that do not interfere with each other in a side 131c. Each of the conductive pads 1321 to 1325 is arranged in a position around the notched portions 1311, 1312, and 1313 on the surface 103a. Each of the conductive pads 1341 to 1345 is arranged in a position around the notched portions 1331, 1332, and 1333 on the rear surface 103b.

Note that a detailed configuration each of the notched portions 1311 to 1313 and the notched portions 1331 to 1333 is similar to a detailed configuration of the notched portions 311 to 313 in the embodiment. A detailed configuration of each of the conductive pads 1321 to 1325 and the conductive pads 1341 to 1345 is similar to a detailed configuration of the conductive pads 321 to 325 in the embodiment.

The conductive cover 104 includes a top plate 104a, a plurality of side plates 104b to 104d, a plurality of claw portions 104e, 104f, and 104g, a plurality of protruded portions 104h, 104i, 104j, 104k, and 104m, and a plurality of recessed portions 104h1, 104h2, 104i1, 104i2, 104j1, 104j2, 104k1, 104k2, 104m1, and 104m2. The plurality of claw portions 104e, 104f, and 104g correspond to the plurality of notched portions 1311, 1312, and 1313 in the substrate 103. Each of the claw portions 104e, 104f, and 104g may be configured in a vertical type extended in a −Z direction from a lower end side (end portion on −Z side) of the conductive cover 104. The plurality of protruded portions 104h, 104i, 104j, 104k, and 104m corresponds to the plurality of conductive pads 1321, 1322, 1323, 1324, and 1325 on the substrate 103. Each of the protruded portions 104h, 104i, 104j, 104k, and 104m is in contact with a corresponding conductive pad in attachment of the conductive cover 104. The plurality of recessed portions 104h1, 104h2, 104i1, 104i2, 104j1, 104j2, 104k1, 104k2, 104m1, and 104m2 corresponds to the plurality of protruded portions 104h, 104i, 104j, 104k, and 104m. Each of the recessed portions 104h1, 104h2, 104i1, 104i2, 104j1, 104j2, 104k1, 104k2, 104m1, and 104m2 faces the surface 103a of the substrate 103 in attachment of the conductive cover 104.

Note that a detailed configuration of each of the claw portions 104e, 104f, and 104g is similar to a detailed configuration of each of the claw portions 4e, 4f, and 4g in the embodiment. A detailed configuration of each of the protruded portions 104h, 104i, 104j, 104k, and 104m is similar to a detailed configuration of each of the protruded portions 4h, 4i, 4j, 4k, and 4m in the embodiment. A detailed configuration of each of the recessed portions 104h1, 104h2, 104i1, 104i2, 104j1, 104j2, 104k1, 104k2, 104m1, and 104m2 is similar to a detailed configuration of each of the recessed portions 4h1, 4h2, 4i1, 4i2, 4j1, 4j2, 4k1, 4k2, 4m1, and 4m2 in the embodiment.

The conductive cover 106 includes a top plate 106a, a plurality of side plates 106b to 106d, a plurality of claw portions 106e, 106f, and 106g, a plurality of protruded portions 106h, 106i, 106j, 106k, and 106m, and a plurality of recessed portions 106h1, 106h2, 106i1, 106i2, 106j1, 106j2, 106k1, 106k2, 106m1, and 106m2. The plurality of claw portions 106e, 106f, and 106g correspond to the plurality of notched portions 1311, 1312, and 1313 in the substrate 103. Each of the claw portions 106e, 106f, and 106g may be configured in a vertical type extended in a +Z direction from a lower end side (end portion on +Z side) of the conductive cover 106. The plurality of protruded portions 106h, 106i, 106j, 106k, and 106m corresponds to the plurality of conductive pads 1341, 1342, 1343, 1344, and 1345 in the substrate 103. Each of the protruded portions 106h, 106i, 106j, 106k, and 106m is in contact with a corresponding conductive pad in attachment of the conductive cover 106. The plurality of recessed portions 106h1, 106h2, 106i1, 106i2, 106j1, 106j2, 106k1, 106k2, 106m1, and 106m2 corresponds to the plurality of protruded portions 106h, 106i, 106j, 106k, and 106m. Each of the recessed portions 106h1, 106h2, 106i1, 106i2, 106j1, 106j2, 106k1, 106k2, 106m1, and 106m2 faces the rear surface 103b of the substrate 103 in attachment of the conductive cover 106.

Note that a detailed configuration of each of the claw portions 106e, 106f, and 106g can be similarly described by switching of +Z and −Z in the description of a detailed configuration of each of the claw portions 4e, 4f, and 4g in the embodiment. A detailed configuration of each of the protruded portions 106h, 106i, 106j, 106k, and 106m can be similarly described by switching of +Z and −Z in the description of a detailed configuration of each of the protruded portions 4h, 4i, 4j, 4k, and 4m in the embodiment. A detailed configuration of each of the recessed portions 106h1, 106h2, 106i1, 106i2, 106j1, 106j2, 106k1, 106k2, 106m1, and 106m2 can be similarly described by switching of +Z and −Z in the description of a detailed configuration of each of the recessed portions 4h1, 4h2, 411, 4i2, 4j1, 4j2, 4k1, 4k2, 4m1, and 4m2 in the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a substrate having a first principal surface and a second principal surface, the second principal surface being arranged on an opposite side of the first principal surface;
a first memory and a controller arranged on the first principal surface;
a second memory arranged on the second principal surface;
a first conductive cover that is provided on a side of the first principal surface and that covers at least a part of the first memory and the controller; and
a second conductive cover that is provided on a side of the second principal surface and that covers at least a part of the second memory,
wherein the substrate has
a first notched portion arranged at a first position in a first edge of the substrate,
a second notched portion arranged at a second position in a second edge of the substrate,
a third notched portion arranged at a third position in the first edge of the substrate, and
a fourth notched portion arranged at a fourth position in the second edge of the substrate,
the first conductive cover has
a first top plate portion,
a first side plate portion,
a second side plate portion,
a first claw portion that is extended from a lower end of the first side plate in a direction intersecting with the first principal surface and that is interlocked with the first notched portion,
a second claw portion that is extended from a lower end of the second side plate in the direction intersecting with the first principal surface and that is interlocked with the second notched portion,
the second conductive cover has
a second top plate portion,
a third side plate portion,
a fourth side plate portion,
a third claw portion that is extended from a lower end of the third side plate in a direction intersecting with the second principal surface and that is interlocked with the third notched portion, and
a fourth claw portion that is extended from a lower end of the fourth side plate in the direction intersecting with the second principal surface and that is interlocked with the fourth notched portion,
the substrate, the first conductive cover, and the second conductive cover each have a shape complying with a form factor,
the first notched portion is arranged at the first position in a first outer edge of the shape,
the second notched portion is arranged at the second position in a second outer edge of the shape,
the third notched portion is arranged at the third position in the first outer edge of the shape, and
the fourth notched portion is arranged at the fourth position in the second outer edge of the shape.

2. The semiconductor storage device according to claim 1, wherein the first claw portion is not protruded from the substrate to a side of the second principal surface in a side view,
the second claw portion is not protruded from the substrate to the side of the second principal surface in the side view,
the third claw portion is not protruded from the substrate to a side of the first principal surface in the side view, and
the fourth claw portion is not protruded from the substrate to the side of the first principal surface in the side view.

3. The semiconductor storage device according to claim 1, wherein a leading end surface of the first claw portion is along an extended surface of the second principal surface,
a leading end surface of the second claw portion is along the extended surface of the second principal surface,
a leading end surface of the third claw portion is along an extended surface of the first principal surface, and
a leading end surface of the fourth claw portion is along the extended surface of the first principal surface.

4. The semiconductor storage device according to claim 1, wherein an outer surface of the first claw portion is placed on an inner side of the outer edge of the substrate in a planar view,
an outer surface of the second claw portion is placed on the inner side of the outer edge of the substrate in the planar view,
an outer surface of the third claw portion is placed on the inner side of the outer edge of the substrate in the planar view, and
an outer surface of the fourth claw portion is placed on the inner side of the outer edge of the substrate in the planar view.

5. The semiconductor storage device according to claim 1, wherein an outer surface of the first claw portion is included in a surface continuous with an outer surface of the first side plate,
an outer surface of the second claw portion is included in a surface continuous with an outer surface of the second side plate,
an outer surface of the third claw portion is included in a surface continuous with an outer surface of the third side plate, and
an outer surface of the fourth claw portion is included in a surface continuous with an outer surface of the fourth side plate.

6. The semiconductor storage device according to claim 5, wherein the first claw portion is integrated with the first side plate,
the second claw portion is integrated with the second side plate,
the third claw portion is integrated with the third side plate, and
the fourth claw portion is integrated with the fourth side plate.

7. The semiconductor storage device according to claim 1, wherein the outer edge of the substrate has a first side, and a second side facing the first side,
the first notched portion is arranged on the first side,
the second notched portion is arranged on the second side,
the third notched portion is arranged on the first side, and
the fourth notched portion is arranged on the second side.

8. The semiconductor storage device according to claim 1, wherein the outer edge of the substrate has a first side, and a second side intersecting with the first side,
the first notched portion is arranged on the first side,
the second notched portion is arranged on the second side,
the third notched portion is arranged on the first side, and
the fourth notched portion is arranged on the second side.

9. The semiconductor storage device according to claim 8, wherein the substrate further includes a third conductive pad, the first conductive cover further has a third protruded portion that is extended from the lower end of the second side plate in the direction intersecting with the substrate and that is in contact with the third conductive pad, and the second conductive cover further has a fourth protruded portion that is extended from the lower end of the fourth side plate in the direction intersecting with the substrate and that is in contact with the fourth conductive pad.

10. The semiconductor storage device according to claim 1, wherein the substrate further has a fifth notched portion in the outer edge, the first conductive cover further has a fifth side plate portion, and a fifth claw portion that is extended from a lower end of the fifth side plate in the direction intersecting with the principal surface and that is interlocked with the fifth notched portion, the substrate further has a sixth notched portion in the outer edge, and the second conductive cover further has a sixth side plate portion, and a sixth claw portion that is extended from a lower end of the sixth side plate in the direction intersecting with the principal surface and that is interlocked with the sixth notched portion.

11. The semiconductor storage device according to claim 10, wherein the first claw portion is not protruded from the substrate to a side of the second principal surface in a side view, the second claw portion is not protruded from the substrate to the side of the second principal surface in the side view, the fifth claw portion is not protruded from the substrate to the side of the second principal surface in the side view, the third claw portion is not protruded from the substrate to a side of the first principal surface in the side view, the fourth claw portion is not protruded from the substrate to the side of the first principal surface in the side view, and the sixth claw portion is not protruded from the substrate to the side of the first principal surface in the side view.

12. The semiconductor storage device according to claim 10, wherein a leading end surface of the first claw portion is along an extended surface of the second principal surface, a leading end surface of the second claw portion is along the extended surface of the second principal surface, a leading end surface of the fifth claw portion is along the extended surface of the second principal surface, a leading end surface of the third claw portion is along an extended surface of the first principal surface, a leading end surface of the fourth claw portion is along the extended surface of the first principal surface, and a leading end surface of the sixth claw portion is along the extended surface of the first principal surface.

13. The semiconductor storage device according to claim 10, wherein an outer surface of the first claw portion is placed on an inner side of the outer edge of the substrate in a planar view, an outer surface of the second claw portion is placed on the inner side of the outer edge of the substrate in the planar view, an outer surface of the fifth claw portion is placed on the inner side of the outer edge of the substrate in the planar view, an outer surface of the third claw portion is placed on the inner side of the outer edge of the substrate in the planar view, an outer surface of the fourth claw portion is placed on the inner side of the outer edge of the substrate in the planar view, and an outer surface of the sixth claw portion is placed on the inner side of the outer edge of the substrate in the planar view.

14. The semiconductor storage device according to claim 10, wherein a leading end of the first protruded portion is placed on the side of becoming far from the first principal surface compared to the first principal surface in a side view, and a leading end of the second protruded portion is placed on the side of becoming far from the second principal surface compared to the second principal surface in the side view.

15. The semiconductor storage device according to claim 10, wherein the first conductive cover further has a third recessed portion that is arranged on an opposite side of the first claw portion with respect to the first protruded portion and that is recessed to the side of becoming far from the first principal surface compared to the first protruded portion, and the second conductive cover further has a fourth recessed portion that is arranged on an opposite side of the third claw portion with respect to the second protruded portion and that is recessed to the side of becoming far from the second principal surface compared to the second protruded portion.

16. The semiconductor storage device according to claim 1, wherein the substrate further includes a first conductive pad, the first conductive cover further has a first protruded portion that is extended from the lower end of the first side plate in the direction intersecting with the substrate and that is in contact with the first conductive pad, the substrate further includes a second conductive pad, and the second conductive cover further has a second protruded portion that is extended from the lower end of the third side plate in the direction intersecting with the substrate and that is in contact with the second conductive pad.

17. The semiconductor storage device according to claim 1, wherein the first conductive cover further has a first protruded portion, and a first recessed portion that is arranged between the first protruded portion and the first claw portion and that is recessed to a side of becoming far from the first principal surface compared to the first protruded portion, and the second conductive cover further has a second protruded portion, and a second recessed portion that is arranged between the second protruded portion and the third claw portion and that is recessed to a side of becoming far from the second principal surface compared to the second protruded portion.

18. The semiconductor storage device according to claim 17,
  wherein a leading end of the first protruded portion is placed on the side of the first principal surface compared to a leading end of the first claw portion in a side view, and
  a leading end of the second protruded portion is placed on the side of the second principal surface compared to a leading end of the third claw portion in the side view.

* * * * *